United States Patent [19]

Possin et al.

[11] Patent Number: 5,281,546

[45] Date of Patent: Jan. 25, 1994

[54] METHOD OF FABRICATING A THIN FILM TRANSISTOR USING HYDROGEN PLASMA TREATMENT OF THE INTRINSIC SILICON/DOPED LAYER INTERFACE

[75] Inventors: George E. Possin; Robert F. Kwasnick, both of Schenectady; Brian W. Giambattista, Scotia, all of N.Y.

[73] Assignee: General Electric Company, Schenectady, N.Y.

[21] Appl. No.: 939,749

[22] Filed: Sep. 2, 1992

[51] Int. Cl.⁵ .................................. H01L 21/265
[52] U.S. Cl. ............................ 437/40; 437/41; 437/101; 437/937; 148/DIG. 1
[58] Field of Search ............... 437/40, 2, 4, 5, 101, 437/909, 937, 41; 148/DIG. 1

[56] References Cited

U.S. PATENT DOCUMENTS

| | | | |
|---|---|---|---|
| 4,741,964 | 5/1988 | Haller | 437/40 |
| 4,769,338 | 9/1988 | Ovshinsky et al. | 437/914 |
| 5,047,360 | 9/1991 | Nicholas | 437/40 |
| 5,114,869 | 5/1992 | Tanaka et al. | 437/40 |

FOREIGN PATENT DOCUMENTS

| | | | |
|---|---|---|---|
| 0310932 | 12/1990 | Japan | 437/937 |
| 0132074 | 6/1991 | Japan | 437/911 |

OTHER PUBLICATIONS

Ihara et al., Improvement of Hydrogenated Amorphous Silicon n-i-p Diode Performance by H₂ Plasma Treatment for i/p Interface, Dec. 1990, Japanese Journal of Applied Physics, vol. 29, No. 12, pp. L2159-L2162.
Yamaguchi et al., The Effect of Hydrogen Plasma on the Properties of a-Si:H/a-Si$_{1-x}$N$_x$:H Superlattices, 1988, Philosophical Magazine Letters, vol. 58, No. 4, 213-218.
Fenner et al., Silicon Surface Passivation by Hydrogen Termination: A Comparative Study of Preparation Methods, Jul. 1, 1989, J. Appl. Phys. 66 (1).
Wu et al., Passivation Kinetics of Two Types of Defects in Polysilicon TFT by Plasma Hydrogenation, Apr. 1991, IEEE Electron Device Letters, vol. 12, No. 4.
Chen, Elimination of Light-Induced Effect in Hydrogenated Amorphous Silicon, Oct. 3, 1988, Appl. Phys. Lett. 53(14).
Veprek et al., Surface Hydrogen Content and Passivation of Silicon Deposited by Plasma Induced Chemical Vapor Deposition from Silane and the Implications for the Reaction Mechanism, Jul./Aug. 1989, J. Vac. Sci. Technol. A7(4).
Jackson et al., Effect of Hydrogen on Disorder in Amorphous Silicon, 1991, Philosophical Magazine B, vol. 64, No. 5, 611-622.

Primary Examiner—Brian E. Hearn
Assistant Examiner—Tuan Nguyen
Attorney, Agent, or Firm—Donald S. Ingraham; Marvin Snyder

[57] ABSTRACT

A method of fabricating a thin film transistor (TFT) including the steps of forming a gate conductor on a substrate; depositing a gate dielectric layer over the gate conductor; depositing a layer of amorphous silicon over the gate dielectric layer; treating the exposed surface of the amorphous silicon with a hydrogen plasma; depositing a layer of n+ doped silicon over the treated amorphous silicon surface such that an interface is formed between the amorphous silicon and the n+ doped layer that has relatively low contact resistance; depositing a layer of source/drain metallization over the n+ doped layer; and patterning the source/drain metallization and portions of the underlying n+ doped layer to form source and drain electrodes. The TFT material layers are preferably deposited by plasma enhanced chemical vapor deposition. The hydrogen plasma treatment is advantageously used both when vacuum is maintained during the various deposition steps, and when vacuum is broken, for the purposes of patterning the amorphous silicon layer or the like, such that the amorphous silicon layer is passivated with the hydrogen plasma treatment prior to the deposition of the n+ doped layer.

8 Claims, 2 Drawing Sheets

METHOD OF FABRICATING A THIN FILM TRANSISTOR USING HYDROGEN PLASMA TREATMENT OF THE INTRINSIC SILICON/DOPED LAYER INTERFACE

RELATED APPLICATIONS AND PATENTS

This application is related to copending application of R. F. Kwasnick and G. E. Possin, Ser. No. 07/939,746, filed concurrently with this application, entitled "Method of Fabricating a Thin Film Transistor Using Hydrogen Plasma Treatment of the Silicon Nitride/Intrinsic Silicon Interface", which application is assigned to the same assignee of the present invention and incorporated herein by reference.

BACKGROUND OF THE INVENTION

This invention relates generally to the fabrication of semiconductor devices and in particular to field effect transistors such as amorphous silicon thin film transistors (TFTs).

Thin film transistors fabricated from, among other materials, amorphous silicon, are commonly used to control arrays of solid state devices such as photodiodes, liquid crystals, or the like, which form the active parts of displays, facsimile devices, or imagers. Performance of such an array of active devices is typically enhanced by improving response (or switching) time of the TFTs, reducing switching transients and noise, reducing RC response time, and increasing the fill factor (i.e., increasing the portion of the total pixel area taken up by the active device in imager and display devices).

One important factor affecting performance is the contact resistance between conducting and semiconducting layers in the transistor. Contact resistance is one factor which determines the efficiency with which the TFT conducts a signal once the conductive channel in the semiconductor material has been established. Typically, TFTs include a doped semiconductor layer (that is, a layer of semiconductor material doped to exhibit a particular conductivity; typically for the devices discussed herein, this layer is doped to exhibit n+conductivity) disposed between the semiconductor layer and the source and drain electrodes to enhance the electrical contact between those components. It is desirable to reduce contact resistance at the interface between the amorphous silicon semiconductor material and the n+doped silicon. High resistance at this interface can result from degraded surface conditions, such as might be caused by impurities or physical degradation of the surface such as pitting or the like. Improved contact resistance at this interface, however, has numerous beneficial effects on TFT performance, such as making possible the construction of a small device with lower capacitance noise and transients associated with switching, and higher switching speeds.

It is thus desirable to fabricate TFTs through a process that produces a transistor having desirable electrical characteristics, such as low contact resistance between conductive and semiconductive layers. The fabrication process must also produce a device having mechanical characteristics, such as structural integrity and component arrangement, that enable it to exhibit the desired electrical characteristics when put to its intended use. For example, the device must not structurally deteriorate through loss of adhesion between the component layers of the device. Plasma-enhanced chemical vapor deposition (PECVD) is commonly used for depositing materials to form TFTs. The fabrication process necessarily involves deposition of multiple layers of material over a substrate and patterning portions of these layers to form the desired TFT island structures. The layers of materials should adhere well to one another during and after being exposed to these processing steps. It is desirable that any treatment to enhance structural stability be compatible with PECVD techniques, which require the device to be exposed to elevated temperatures, electric fields, and reduced pressure during the deposition processes.

It has been observed that treatment of portions of semiconductor devices with hydrogen can have advantageous effects. For example, Ihara and Nozaki reported in "Improvement of Hydrogenated Amorphous Silicon n-i-p Diode Performance by $H_2$ Plasma Treatment for i/p Interface", *Japanese Journal of Applied Physics*, Vol. 29, pp. L2159-62 (December 1990), that exposing intrinsic silicon to a hydrogen plasma (during the fabrication process of a diode) prior to depositing a p+doped layer resulted in a diode having a slightly lower reverse current and a forward current of about one order of magnitude greater than the comparable currents in a similar device fabricated without the hydrogen plasma treatment. Ihara et al. postulate that the improved electrical performance results from fewer defects along the interface as a consequence of both the physical and chemical interactions of the hydrogen plasma with the intrinsic silicon in which impurities are removed from the surface and the surface is stabilized, making it difficult to oxidize.

It is thus an object of this invention to provide a method of fabricating a thin film transistor that consistently produces a TFT with low contact resistance between the amorphous silicon and n+doped silicon layer regardless of whether vacuum is broken between the deposition of these layers.

It is a still further object of this invention to provide a method of fabricating a TFT that exhibits good adhesion between layers of the device.

SUMMARY OF THE INVENTION

In accordance with this invention, a thin film transistor is fabricated by forming a gate conductor on an upper surface of a substrate; depositing a gate dielectric layer over the gate conductor; depositing a layer of amorphous silicon over the gate dielectric layer; treating the exposed surface of the amorphous silicon with a hydrogen plasma; depositing a layer of n+ doped amorphous silicon over the treated amorphous silicon layer such that an interface is established between said amorphous silicon and said n+doped layer having relatively low contact resistance; depositing a layer of source/drain metallization over the n+doped silicon layer; and patterning the source/drain metallization layer to form respective source and drain electrodes. The hydrogen plasma is applied to the exposed amorphous silicon surface in a plasma enhanced chemical vapor deposition reactor vessel at a selected flow rate and a selected pressure for a selected exposure time and at a selected power density. The hydrogen treatment is advantageously applied in sequence after the deposition of the amorphous silicon layer, with vacuum being maintained in the reactor vessel; alternatively the hydrogen plasma treatment is advantageously applied in fabrication processes in which vacuum is broken between the deposition of the amorphous silicon layer and the n+layer, such as to pattern the amorphous silicon and underlying layers into a TFT island (e.g., forming the base structures for an array of TFTs to be formed on a wafer) or to form structures such as overlying second insulation layer segment for the purpose of aligning the source and drain electrodes over the gate conductor.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

DETAILED DESCRIPTION OF THE INVENTION

Figure 1:
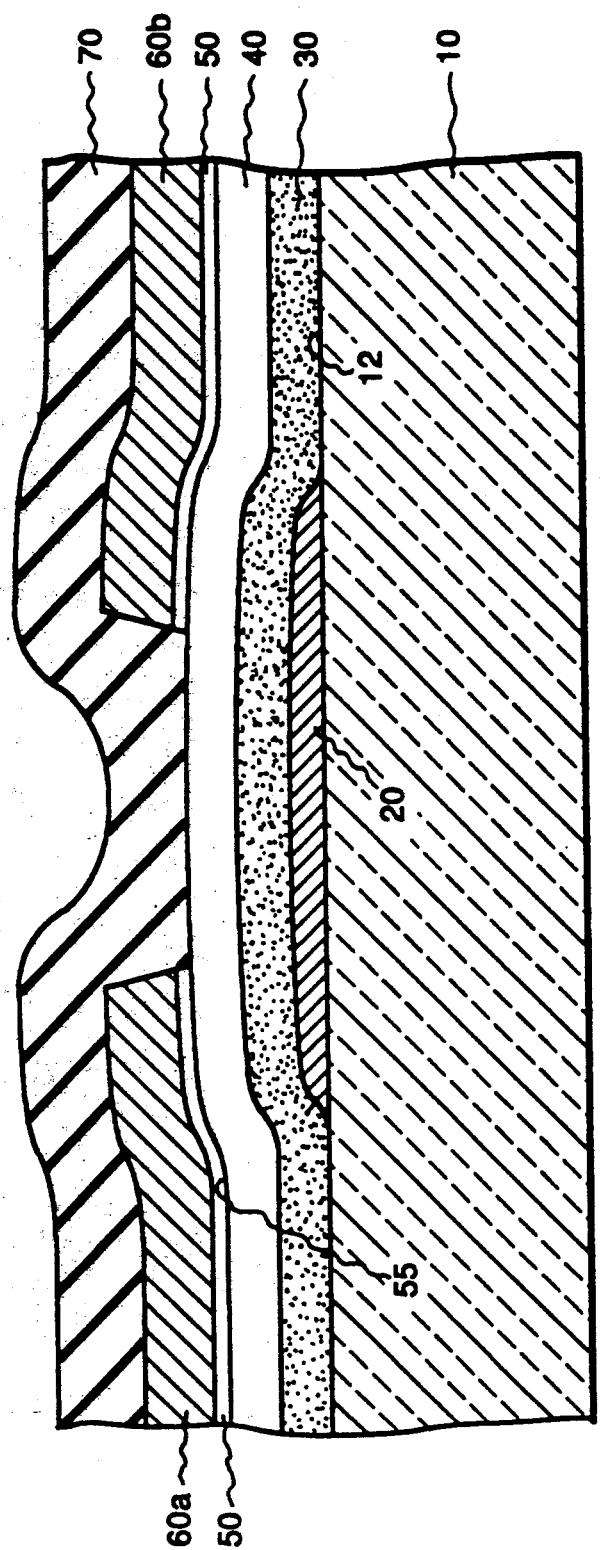
FIG. 1 illustrates a typical TFT fabricated in accordance with this invention.

The method of this invention is advantageously used in the fabrication of inverted thin film transistors (TFTs) that have an amorphous silicon/doped silicon interface at which it is desired to reduce contact resistance. FIG. 1 illustrates a representative TFT fabricated in accordance with this invention.

The TFT is fabricated on a substrate 10 which typically comprises an insulative material such as glass or the like. A gate conductor 20 is formed on an upper surface 12 of substrate 10. Gate conductor 20 typically comprises a conductive layer of a metal such as aluminum (Al), chromium (Cr), titanium (Ti), or the like, or may alternatively comprise a multi-layer structure of conductive materials. After the desired conductive material is deposited on substrate 10, the conductive material is patterned to form the gate conductor. As used herein, "patterned" refers to shaping a deposited layer of material to have a desired form and dimensions, using, for example, photolithography or other methods for selectively shaping a layer, such as planarization and selective etching techniques.

A gate dielectric layer 30 is then deposited over gate conductor 20 and the exposed portions of substrate 10 upper surface 12. This layer is deposited by conventional deposition techniques, preferably such as plasma enhanced chemical vapor deposition (PECVD). Gate dielectric layer 30 typically comprises silicon nitride ($SiN_x$) or silicon oxide ($SiO_y$) and is deposited to a thickness between about 200 Å (20 nm) and 3000 Å (300 nm).

Amorphous silicon layer (or semiconductor layer) 40 is deposited over gate dielectric layer 30, for example by a known method such as PECVD. Amorphous silicon layer 40 comprises substantially hydrogenated intrinsic amorphous silicon (a-Si) and is deposited to a thickness of between about 200 Å (20 nm) and 3000 Å (300 nm).

In accordance with this invention the exposed surface of amorphous silicon layer 40 is treated with a hydrogen plasma. As used herein, "treated" refers to the process by which the uncovered (or exposed) surface of the amorphous silicon layer is exposed in a reactor vessel to a hydrogen plasma at a selected flow rate and a selected pressure, for a selected exposure time and at a selected plasma power density. The hydrogen plasma treatment is preferably accomplished in the same reactor vessel used for PECVD of amorphous silicon layer 40. The selected values of the pressure, temperature, and power density may vary within predetermined ranges, discussed below, during the treatment process. Representative values for a reactor vessel having an electrode to substrate distance of about 2.8 cm ($\approx$1.1 inches), an electrode cross-sectional area of about 4560 $cm^2$ ($\approx$30 inch diameter), and which operates at 13.56 MHz, are as follows: the selected plasma flow rate is typically 300 standard cubic centimeters per minute (sccm), but may be in a range between about 30 sccm and 2000 sccm; the selected pressure of the plasma is typically about 400 mTorr, and can range between about 100 mTorr and 2000 mTorr; the selected exposure time and selected plasma power density are usually about 10 minutes and 22 $mW/cm^2$, respectively, with the selected exposure time ranging between about 2 min. and 60 min., and the selected power density ranging between 10 $mW/cm^2$ and 440 $mW/cm^2$. These parameters for applying the hydrogen treatment in the reactor vessel are selected to produce the desired modification of the amorphous silicon exposed surface so as to reduce the contact resistance between the amorphous silicon and overlying layers and to improve or maintain good adhesion between the treated layers (e.g., reducing or eliminating bubbling along the interface of the two materials).

The effect of the hydrogen plasma treatment is that the amorphous silicon surface is exposed to hydrogen ions having energies between about 10 eV and 100 eV that passivate the surface, in part by driving off impurities, in part by smoothing the surface, and in part by altering the chemical composition of the surface. The surface is thus physically and chemically prepared to be covered with a material for making good electrical contact to the source and drain electrodes.

After the exposed surface of the amorphous silicon has been treated with the hydrogen plasma, a layer of n+doped amorphous silicon 50 is deposited over the amorphous silicon. As used herein, n+doped silicon refers to silicon which has been doped to exhibit n+type conductivity. The n+doped silicon is typically deposited to a thickness of about 100 Å to 1500 Å (10 to 150 nm). Due to the physical (i.e., mechanical) and chemical effects of the hydrogen plasma on the exposed surface of the amorphous silicon, an interface 55 is established between the amorphous silicon and the n+layer such that there is a relatively low contact resistance (as indicated by higher effective mobility measurements as set out below) between amorphous silicon layer 40 and n+layer 50. Interface 55 typically comprises the surfaces of the two respective adjoining layers, with the contact resistance being determined by the interrelation of the two adjoining materials to a depth between about 50 Å and 100 Å (5 to 10 nm) from the outermost portion of the surface.

A layer of source/drain metallization 60 is then deposited over the n+layer to a thickness of between about 0.05 $\mu$m and 2 $\mu$m, and then patterned to form a source electrode 60a and a drain electrode 60b (the orientation of the source and the drain electrode in FIG. 1 is arbitrary; dependent on device arrangement, either electrode can serve as the source or the drain). Patterning of source and drain electrodes 60a, 60b typically includes removing a portion of metallization layer 60 and the n+doped layer disposed thereunder in the vicinity of gate conductor 20 such that the source and drain the vicinity of gate conductor 20 such that the source and drain conductor, with only amorphous silicon semiconductor layer (and the layers disposed under the semiconductor layer) remaining between the respective source and drain electrodes. A passivation dielectric 70, such as silicon nitride or silicon oxide, is typically deposited to a thickness of between about 1,000 Å (100 nm) and 10,000 Å (1000 nm) over the completed device.

For reasons set out in copending application Ser. No. 07/939,746, which is assigned to the assignee of the present invention and incorporated herein by reference, it is also advantageous for the fabrication of a TFT to apply a hydrogen plasma treatment to the gate dielectric layer prior to the deposition of the amorphous silicon layer, although such a hydrogen plasma treatment does not affect the contact resistance between the amorphous silicon and the doped silicon contact layer.

This invention is advantageously used in fabricating processes in which vacuum is maintained in the PECVD-reactor vessel between the deposition of gate dielectric layer 30 and depositing n+doped layer 50. Alternatively, the method of this invention is advantageously used in TFT fabrication processes in which vacuum is broken between the deposition of amorphous silicon layer 40 and deposition of n+doped layer 50. For example, vacuum may be broken to process the materials disposed on the substrate at that point in the fabrication process, such as patterning amorphous silicon layer 40 (and underlying layers as appropriate) to form TFT islands. Especially after vacuum is broken and patterning is performed on the amorphous silicon layer, degradation of the amorphous silicon layer frequently occurs. Preferably, the exposed surface of the amorphous silicon is cleaned in hydrofluoric acid (HF) prior to being placed in the reactor vessel in order to remove oxide that may have built up on the surface during the earlier processing steps. During the heating of the wafer to the process temperature of between about 225° and 275° C. the chamber is purged with flowing $H_2$ to minimize oxide formation.

Figure 2:
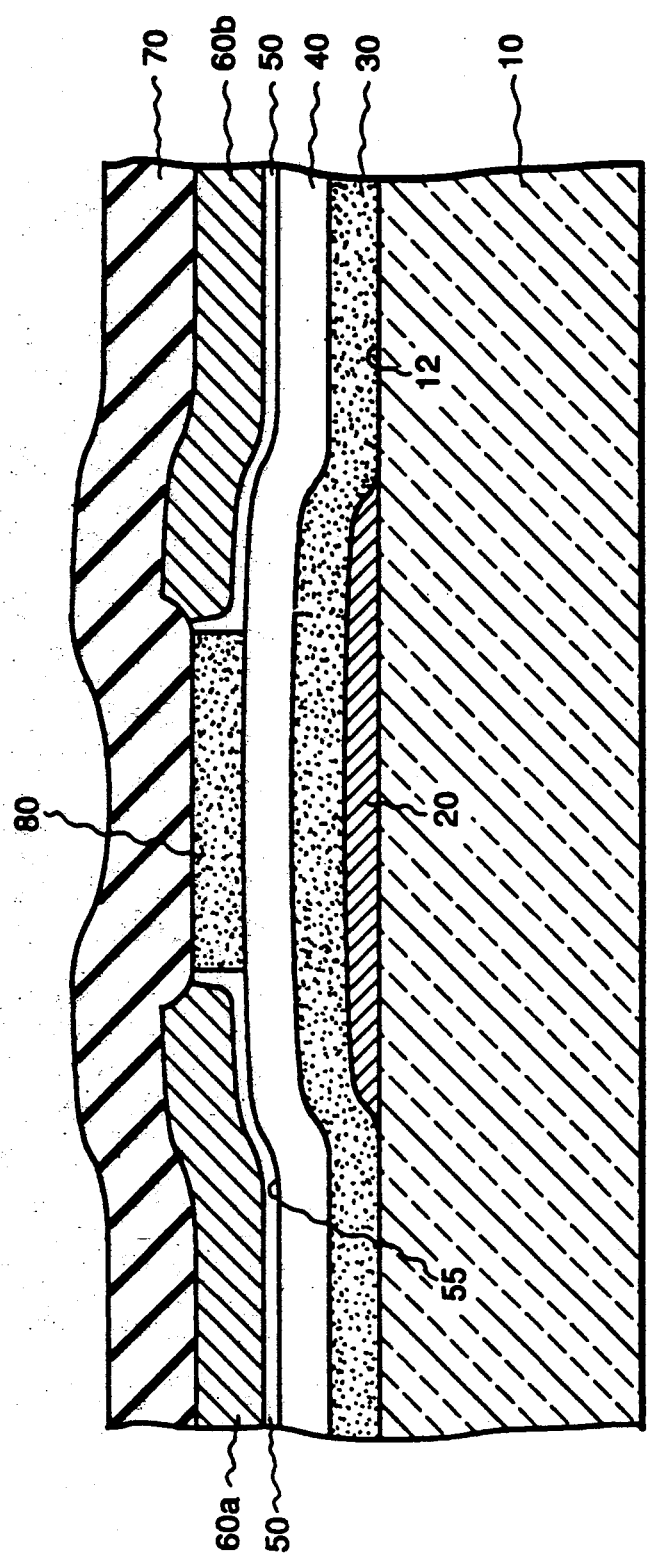
FIG. 2 illustrates a TFT fabricated in accordance with this invention which has a structure requiring that vacuum be broken after deposition of the amorphous silicon semiconductor material and prior to deposition of the doped semiconductor material.

One TFT fabrication process which includes breaking vacuum in the reactor vessel between deposition of the amorphous silicon layer and the deposition of the n+layer is discussed in U.S. Pat. No. 5,010,027, of G. E. Possin (the '027 patent) and assigned to the assignee of the present invention, which is incorporated herein by reference. FIG. 2 illustrates a TFT having a structure that results from the fabrication process in the '027 patent; the structure of this device is similar to the TFT illustrated in FIG. 1 except that a second insulation layer segment 80 is disposed above gate conductor 20. In accordance with the process in the '027 patent, after the deposition of amorphous silicon semiconductor layer 40 the materials on the substrate are processed, and in this processing vacuum is broken (as used herein, processing refers to etching, patterning, or preparing the materials disposed on the wafer at a particular point in the fabrication procedure). For example, a second dielectric layer is deposited, vacuum is broken, and a photoresist layer is deposited on the second dielectric layer; the second dielectric layer is patterned via through-the-substrate exposure of the photoresist and selective etching to form a second insulation layer segment 80 disposed above the gate electrode. Second insulation layer segment 80 is disposed to allow precise alignment of source and drain electrodes at a selected overlap distance over the gate electrode. The upper (i.e., farthest from substrate upper surface 12) surface of amorphous silicon semiconductor layer 40 is thus exposed to deposition of other materials and etchants to remove these layers before the doped silicon layer is deposited. In accordance with this invention, after patterning, substrate 10 with the overlying processed layers is placed in the PECVD reactor vessel, vacuum is established and the hydrogen plasma treatment step described above is initiated. After the hydrogen plasma treatment step, doped silicon layer 50 is deposited and fabrication of the TFT is completed.

Thin film transistors fabricated on test wafers in accordance with this invention have exhibited consistently low contact resistances, as illustrated by the following examples. Specifically, TFTs were fabricated on test wafers to produce a structure similar to that illustrated in FIG. 1 (without breaking vacuum between the deposition of the amorphous silicon layer 40 and the doped silicon layer 50), with a gate dielectric layer of silicon nitride having a thickness of about 1500 Å deposited over the gate conductor in a plasma-enhanced chemical vapor deposition process; and a layer of amorphous silicon, deposited by PECVD to a thickness of 2000 Å. Without breaking vacuum, the exposed surface of the amorphous silicon was treated with a hydrogen plasma at a flow rate of 300 sccm, a pressure of 400 mTorr, for 10 minutes at a power density of 22 mW/cm$^2$. A n+layer was deposited over the exposed amorphous silicon to a thickness of 500 Å. Source/drain metallization of molybdenum was then deposited to a thickness of about 2000 Å and patterned to form source and drain electrodes.

Comparison of TFTs fabricated without the hydrogen plasma treatment to TFTs otherwise similar but fabricated in accordance with this invention, demonstrates that contact resistance was lower in devices fabricated in accordance with this invention. One measure of contact resistance is obtained by comparing the effective mobilities of short channels (having a length of $\approx 5$ $\mu$m) of devices and the long channels (having a length of $\approx 40$ $\mu$m) of devices, but fabricated on the same wafer so that they are otherwise the same. As contact resistance has a larger proportionate effect on the short channel effective mobility, improvement in contact resistance is primarily seen as increased effective mobility in short channel devices (as compared with other short channel devices). Effective mobility is determined from the slope of a plot of the drain current versus gate voltage at low drain voltage, e.g., 8 V and 0.5 V, respectively (that is, a low drain voltage relative to the gate voltage). To normalize the comparison of devices fabricated on different wafers, which can experience at least some minor variations in fabrication parameters, comparison of ratio of short to long channel effective mobility of devices formed on a given wafer with the ratio of devices formed on a different wafer is helpful. In particular, higher values of this ratio indicate smaller values of contact resistance. Data obtained from TFTs fabricated in accordance with this invention and from similarly-structured TFTs fabricated without the hydrogen plasma treatment are as follows:

| Wafer | Hydrogen Plasma Treatment | Long Channel Effective Mobility (cm²/V-sec) | Short Channel Effective Mobility (cm²/V-sec) | Effective Mobility Ratio |
|---|---|---|---|---|
| A | No | .52 | .22 | .42 |
| B | No | .44 | .16 | .36 |
| C | No | .59 | .26 | .44 |
| D | No | .53 | .22 | .42 |
| E | Yes | .58 | .32 | .55 |
| F | Yes | .58 | .26 | .45 |
| G | Yes | .57 | .33 | .58 |
| H | Yes | .57 | .26 | .46 |

[$V_{drain}$ = 0.5V; $V_{gate}$ = 8V]

A test wafer was prepared having TFTs fabricated in accordance with the embodiment of this invention in which vacuum is broken between the deposition of the amorphous silicon and the n+doped silicon layer, with the amorphous silicon semiconductor layer being exposed to processing steps (etching and the like) as might be undertaken in the formation of the device illustrated in FIG. 2. In this fabrication process, the wafer, after completion of the amorphous silicon layer processing steps, was exposed to a a hydrogen purge during "ramp up" heating of the wafer from 200° C. to 275° C. in preparation for the hydrogen plasma treatment and resumption of the PECVD deposition of layers to complete fabrication of the TFT. The hydrogen plasma treatment was applied at 300 sccm, 22 mW/cm² for 10 minutes. The following data were obtained

| Wafer | Hydrogen Plasma Treatment | Long Channel Effective Mobility (cm²/V-sec) | Short Channel Effective Mobility (cm²/V-sec) | Effective Mobility Ratio |
|---|---|---|---|---|
| AA | No | .55 | .21 | .38 |
| BB | No | .59 | .25 | .42 |
| CC | No | .59 | .25 | .42 |
| DD | No | .59 | .25 | .42 |
| EE | Yes | .69 | .37 | .53 |
| FF | Yes | .67 | .40 | .60 |

[$V_{drain}$ = 0.5V; $V_{gate}$ = 8V]

It is evident from the data that the method of fabricating TFTs using hydrogen plasma treatment in accordance with this invention produces devices having low contact resistance; this contact resistance is typically lower than that obtained in devices fabricated by other techniques as evidenced by the consistently higher effective mobility ratio. Additionally, this process can be used to improve amorphous silicon surfaces damaged in normal processing steps (such as when vacuum is broken in the PECVD chamber) so that low contact interfaces with the doped contact layer can be formed.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method of fabricating a thin film transistor (TFT) comprising the steps of:
   forming a gate conductor on an upper surface of a substrate;
   depositing a gate dielectric layer having a selected thickness over the gate conductor;
   depositing a layer of amorphous silicon over said gate dielectric layer;
   treating the exposed surface of the amorphous silicon with a hydrogen plasma;
   depositing a layer of n+doped amorphous silicon over the treated amorphous silicon layer such that an interface is established between said amorphous silicon and said n+doped layer having relatively low contact resistance;
   depositing a layer of source/drain metallization over the n+doped silicon layer; and
   patterning the source/drain metallization layer and underlying portions of said n+doped layer to form respective source and drain electrodes.

2. The method of claim 1 wherein the step of treating the exposed surface of the amorphous silicon with a hydrogen plasma further comprises the steps of:
   disposing the exposed amorphous silicon surface in a reactor vessel;
   applying the hydrogen plasma to the exposed surface at a selected flow rate and a selected pressure, for a selected exposure time at a selected plasma power density.

3. The method of claim 2 wherein:
   said reactor vessel has an electrode to substrate separation of about 2.8 cm and an electrode cross-sectional area of about 4560 cm²;
   said selected hydrogen plasma flow rate is between about 30 sccm and 2000 sccm;
   the selected pressure of said hydrogen plasma is between about 200 mTorr and 2000 mTorr;
   said selected exposure time is between about 2 minutes and 60 minutes; and
   said selected plasma power density is between about 10 mW/cm² and 440 mW/cm².

4. The method of claim 3 wherein the steps of depositing a gate dielectric layer and depositing a layer of amorphous silicon each comprise plasma enhanced chemical vapor deposition of said respective layers in said reactor vessel.

5. The method of claim 4 further comprising the steps of maintaining vacuum in said reactor vessel between each of the steps of depositing a layer of amorphous silicon, treating the exposed surface of the amorphous silicon with hydrogen plasma, and depositing a layer of n+doped amorphous silicon over the treated amorphous silicon layer.

6. The method of claim 4 further comprising the steps of:
   processing the materials disposed on the substrate, said processing including breaking vacuum in said reactor vessel after depositing said layer of amorphous silicon;
   placing the substrate and the processed materials thereon in said reactor vessel; then
   establishing vacuum in said reactor vessel; and
   initiating the step of treating the exposed surface of the amorphous silicon with hydrogen plasma.

7. The method of claim 6 wherein the processing of materials disposed on the substrate comprises the steps of:
   depositing a second dielectric layer over said layer of amorphous silicon;
   breaking vacuum in said reactor vessel;
   depositing a photoresist layer over said second dielectric layer;

patterning said photoresist; and selectively etching said second dielectric layer to form a channel plug underlying the pattered photoresist such that the dimensions of said channel plug correspond to the desired overlap of said source and drain electrodes over said gate conductor.

8. The method of claim 6 further comprising the step of cleaning the amorphous silicon with hydrofluoric acid (HF) prior to placing the substrate and the processed layers thereon into said reactor vessel.

* * * * *